(12) United States Patent
Roberts et al.

(10) Patent No.: US 11,715,975 B2
(45) Date of Patent: Aug. 1, 2023

(54) METHOD FOR REMOTELY MONITORING FAILED SURGE ARRESTER DISCONNECTORS AND ENERGY HARVESTER FOR AUTONOMOUS POWER SUPPLY OF MONITORING DEVICES INSTALLED ON SURGE ARRESTERS

(71) Applicants: Tyco Electronics UK Ltd., Swindon (GB); Tyco Electronics Raychem GmbH, Ottobrunn (DE)

(72) Inventors: Jonathan Roberts, Doddington (GB); Bengt A. Johnnerfelt, Rottingdean (GB); Ladislaus Kehl, Munich (DE)

(73) Assignees: Tyco Electronics Raychem GmbH, Ottobrunn (DE); Tyco Electronics UK Ltd., Swindon (GB)

( * ) Notice: Subject to any disclaimer, the term of this patent is extended or adjusted under 35 U.S.C. 154(b) by 407 days.

(21) Appl. No.: 16/900,107

(22) Filed: Jun. 12, 2020

(65) Prior Publication Data

US 2020/0303950 A1 Sep. 24, 2020

Related U.S. Application Data

(63) Continuation of application No. PCT/EP2018/086021, filed on Dec. 19, 2018.

(30) Foreign Application Priority Data

Dec. 21, 2017 (EP) .................................. 17209613

(51) Int. Cl.
*H02J 1/00* (2006.01)
*G01R 31/12* (2020.01)
*H02J 13/00* (2006.01)

(52) U.S. Cl.
CPC .... *H02J 13/00026* (2020.01); *G01R 31/1236* (2013.01); *H02J 13/00024* (2020.01)

(58) Field of Classification Search
CPC ............. H02J 13/00026; H02J 13/0024; H02J 13/0026; G01R 31/1236; Y04S 40/126; G08B 21/185
See application file for complete search history.

(56) References Cited

U.S. PATENT DOCUMENTS 3,213,321 A * 10/1965 Dalziel .................. H02H 3/347
361/46
4,047,079 A * 9/1977 MacPhee .................. H02H 3/33
361/45

(Continued)

FOREIGN PATENT DOCUMENTS

CN 101636659 A 1/2010
CN 102255954 A 11/2011

(Continued)

OTHER PUBLICATIONS

Office Action from JPO in Appln. No. 2020-533086 dated Jul. 6, 2021, and English translation thereof 13 pp.

(Continued)

*Primary Examiner* — Diane L Lo
*Assistant Examiner* — Abusayeed M Haque
(74) *Attorney, Agent, or Firm* — Barley Snyder (57) ABSTRACT

A method of remotely monitoring a status of a surge arrester disconnector includes providing a long-range wireless mesh communication system including a plurality of disconnectors organized in a plurality of clusters. Each cluster includes a plurality of disconnectors that are physically located within a same cluster area. At least one of the disconnectors in each cluster is coupled to a communication device of a predetermined communication range. The method includes transmitting, from a first cluster, a status signal indicative of (Continued)

a status of a first disconnector in the first cluster to a second cluster located within the predetermined communication range, and consecutively transmitting the status signal from the second cluster to a third cluster within the predetermined communication range, until reaching an end cluster. The method includes transmitting, from the end cluster, the status signal to a monitoring station, and monitoring the status of the first disconnector at the monitoring station based on a result of transmission of the status signal.

15 Claims, 8 Drawing Sheets

(56) References Cited

U.S. PATENT DOCUMENTS

| | | | |
|---|---|---|---|
| 4,168,514 A * | 9/1979 | Howell | H01C 7/12 337/28 |
| 5,237,482 A | 8/1993 | Osterhout et al. | |
| 7,609,158 B2 | 10/2009 | Banting et al. | |
| 2003/0121903 A1 * | 7/2003 | Baker | H05B 1/028 219/509 |
| 2006/0056370 A1 | 3/2006 | Hancock et al. | |
| 2008/0100436 A1 * | 5/2008 | Banting | H02J 13/00017 340/539.22 |
| 2008/0247353 A1 | 10/2008 | Pun | |
| 2009/0323244 A1 * | 12/2009 | Hoopes | H02H 9/042 338/21 |
| 2011/0288799 A1 * | 11/2011 | Cortes | G01R 33/072 702/65 |

FOREIGN PATENT DOCUMENTS

| | | |
|---|---|---|
| CN | 102435812 A | 5/2012 |
| CN | 203275578 U | 11/2013 |
| CN | 203479337 U | 3/2014 |
| CN | 104407208 A | 3/2015 |
| CN | 104580295 A | 4/2015 |
| CN | 204946328 U | 1/2016 |
| JP | 2001-307263 A | 11/2001 |
| JP | 2006309407 A | 11/2006 |
| JP | 2008078963 A | 4/2008 |
| JP | 2008283674 A | 11/2008 |
| JP | 2015023633 A | 2/2015 |
| WO | 2015008412 A1 | 1/2015 |

OTHER PUBLICATIONS

Abstract of JP 2006309407 A, dated Nov. 9, 2006, 1 p.
Abstract of JP 2008078963 A, dated Apr. 3, 2008, 1 p.
Chinese First Office Action, App. No. 201880081938.7, dated Nov. 26, 2021, 11 pages.
PCT Notification, Transmittal of the International Search Report and the Written Opinion, dated May 3, 2019, 18 pages.
Second Chinese Office Action with English Translation, Application No. 201880081938.7, dated Jul. 5, 2022, 14 pages.

* cited by examiner

METHOD FOR REMOTELY MONITORING FAILED SURGE ARRESTER DISCONNECTORS AND ENERGY HARVESTER FOR AUTONOMOUS POWER SUPPLY OF MONITORING DEVICES INSTALLED ON SURGE ARRESTERS

CROSS-REFERENCE TO RELATED APPLICATIONS

This application is a continuation of PCT International Application No. PCT/EP 2018/086021, filed on Dec. 19, 2018, which claims priority under 35 U.S.C. § 119 to European Patent Application No. 17209613.3, filed on Dec. 21, 2017.

FIELD OF THE INVENTION

The present invention relates generally to power transmission and distribution systems and the protection of electrical equipment against over-voltages and consecutive disturbances for power users and, more particularly, to techniques for remotely detecting the location and/or status of failed surge arresters equipped with disconnectors that are used in protecting electrical equipment against over-voltages.

BACKGROUND

In many countries, more than 50% of all disturbances in power transmission and/or power distribution systems, such as short-time power outages and tripping, are caused by lightning strikes that hit the towers, phase conductors, shielding wires or high objects (like trees or masts) close to a power line. Lightning strikes may cause one or several flashovers in insulator lines of a power transmission and distribution system due to a sharp rise of the voltage across the line insulator until reaching a voltage that triggers an arc discharge, which causes a power short-circuit of the line insulator to ground. In general, when detected by the power transmission and distribution system, the voltage applied to the line insulator is switched off by a circuit breaker for extinguishing the arc and allowing the normal operating voltage to be turned back on again. However, such short-time voltage outages disturb computerized process industries, costing production losses every year, as well as households with electronic installations.

Short-time power tripping caused by lightning strikes is often mitigated by installing surge arresters coupled to disconnectors along the power lines. Line surge arresters (LSA) are frequently used on power lines for both distribution and transmission systems to prevent external flashovers of insulators from lightning or other unexpected overvoltage disturbances. LSAs can be of two different designs, namely, non-gaped line arresters (NGLA) or externally gaped line arresters (EGLA), which can be both used to minimize power disturbances, like tripping, for the end customers. In unprotected towers, flashovers of insulators always lead to power tripping or in a worst case scenario, even to power outages of complete power supply areas. LSAs are intended to perform so that even the end customer's computer will not notice that there has been a lightning stroke on the system.

A conventional line surge arrester is in general capable of changing from a high resistance state, at normal service voltages, into a very low resistance state when it receives a sudden over-voltage, such as those caused by lightning strikes or switching events in the power system, and to return back to the high resistance state after conducting the surge current to ground. However, in the rare event of a lightning strike with excessive energy, the LSA must absorb the full electrical charge from the lightning and, if this charge exceeds the surge arrester capability of receiving energy, the surge arrester will be overloaded. This leads to an irreversible, short-circuit of the LSA to ground and of the power system itself, which could result in power outage and an immediate need for replacement of the failed arrester.

In order to mitigate such power outages, disconnectors are often used in conjunction with surge arresters to automatically disconnect the malfunctioning arrester from ground and consequently, facilitate a fast reclosing of the power system without the need of an immediate replacement of the faulty arrester. The down side of automatically disconnecting the arrester from ground is that surge protection is no longer available at the location of the faulty arrester and the utility may not even notice that an arrester has been disconnected. Therefore, regular visual inspection of the line is required to spot disconnected arresters.

For instance, a disconnector used in conjunction with a NGLA will disconnect the malfunctioning NGLA from the power system so that power can be quickly restored with a fast reclosing system (for e.g. in ten to hundreds of ms). However, since disconnectors are mounted close to the respective surge arresters, they are often located in remote areas and/or in areas where cellular phone coverage is not available. Thus, maintenance personal may take a considerable amount of time to locate a disconnector that has operated. Moreover, it still remains the problem that the respective tower is no longer properly protected against surges, which drastically increases the risk of more flashovers in that tower until the NGLA is replaced.

Arresters of the EGLA type operate somewhat differently from NGLAs as they do not provide a direct current path between phase conductor and earth potential but rather a spark gap in series. Still, the spark gap must have a spark over-voltage lower than that of the respective line insulator. Consequently, if the EGLA becomes overloaded, the respective tower has a significantly higher risk of tripping due to flashover in the spark gap. Hence, also here it is beneficial to use a disconnector so as to avoid a higher flashover risk for the tower in case a failed EGLA is left without replacement for some time.

In both cases, it is important to quickly find a disconnector that has disconnected a malfunctioning surge arrester from ground because a tower with unprotected line insulators becomes exposed to a significantly higher risk of flashover and subsequent power trippings during the next thunderstorm.

However, as power lines usually run longitudinally across the landscape, many times without road access or cellular coverage, it is very difficult and time consuming to find failed arresters. At present, inspections for high voltage transmission lines may be done via helicopter and binoculars or by foot. Still, it may not be easy to see if an earth conductor is loose or not. Thus, visual inspections are a very expensive and time-consuming method, and it may take months before a failed surge arrester is located and replaced. For distribution systems, this inspection is often done by road as these are more often located in urban areas. However, even with binoculars, it may not be easy to find failed arresters as they are installed up in the towers or poles, also in case that lightning detection systems are used. Time to replacement is however important since the distribution transformer now lacks protection.

Suitable sensors installed at the surge arrester location could remotely warn an operator of the power system in case a failure of a surge arrester occurs. However, sensors require power to operate. Batteries require regular, manual replacement, which would eliminate the advantage that sensors could bring in terms of manual inspections. Solar cells require low maintenance but even these require chargeable batteries to bridge the time during low light conditions. Another downside of solar cells is that pollution of the window may reduce their efficiency over time.

Moreover, although a wireless communication method that informs an operator of a distribution power system when an arrester has been overloaded, and at which specific tower, will help maintenance crew to quickly find and replace a faulty arrester, the communication electronics installed at the arrester location also need power for communicating the location and/or status of a faulty arrester.

Thus, there is a need for low power communication methods. Further, in order to take advantage of the benefits of using a sensor and communication electronics for remotely monitoring a failed arrester, it is desirable to have an autonomous power supply that requires a minimum of manual maintenance.

SUMMARY

A method of remotely monitoring a status of a surge arrester disconnector includes providing a long-range wireless mesh communication system including a plurality of disconnectors organized in a plurality of clusters. Each cluster includes a plurality of disconnectors that are physically located within a same cluster area. At least one of the disconnectors in each cluster is coupled to a communication device of a predetermined communication range. The method includes transmitting, from a first cluster, a status signal indicative of a status of a first disconnector in the first cluster to a second cluster located within the predetermined communication range, and consecutively transmitting the status signal from the second cluster to a third cluster within the predetermined communication range, until reaching an end cluster. The method includes transmitting, from the end cluster, the status signal to a monitoring station, and monitoring the status of the first disconnector at the monitoring station based on a result of transmission of the status signal.

BRIEF DESCRIPTION OF THE DRAWINGS

The invention will now be described by way of example with reference to the accompanying Figures, of which.

DETAILED DESCRIPTION OF THE EMBODIMENTS

The present invention will now be more fully described hereinafter with reference to the accompanying drawings, in which exemplary embodiments of the invention are shown. The present invention may, however, be embodied in many different forms and should not be construed as limited to the embodiments set forth herein. Rather, these embodiments are provided so that the disclosure will convey the scope of the invention to those skilled in the art. Like numbers refer to like elements throughout the description.

The accompanying drawings are incorporated into and form a part of the specification for the purpose of explaining the principles of the invention. The drawings are not to be construed as limiting the invention to only the illustrated and described examples of how the invention can be made and used.

The present disclosure proposes to solve the technical problems via at least the following approaches:

A. Radio communication principles and methods

B. Autonomous power supply for monitoring and/or communication devices installed with remote surge arresters C. GPS information D. Method of fault indication Approaches A to D will be separately described in the following. However, each of these approaches may be adopted in isolation or in any combination thereof so as to achieve flexible solutions that can be adapted to each particular situation and that are cost effective and reliable. Furthermore, although embodiments of the present invention will be described below with reference to power transmission systems and power transmission lines, or simply transmission lines, for ease of reference, it is understood that the principles of the present invention are intended to be applicable to power distribution systems and respective power distribution lines.

A. Radio Communication Principle and Method

Surge arresters, and hence disconnectors, are typically installed in clusters along a transmission line in areas where surges due to lightning strikes are most likely. For instance, a transmission tower may have up to 6 arresters installed, although typically there are 1, 2 or 3 arresters per tower, while other towers along the same transmission line may have no installed surge arresters. In order to make the most economical installation and determine how many surge arresters and in which towers these are to be installed, simulations for transmission and distribution lines with respect to electrical performance are usually performed. This means that surge arresters and respective disconnectors along a transmission line are often distributed in an irregular manner and may differ from transmission line to transmission line. Consequently, remote monitoring of the status of surge arresters disconnectors may provide significant benefits to utilities operating transmission lines in remote areas for detecting and localizing failed arresters.

Figure 1:
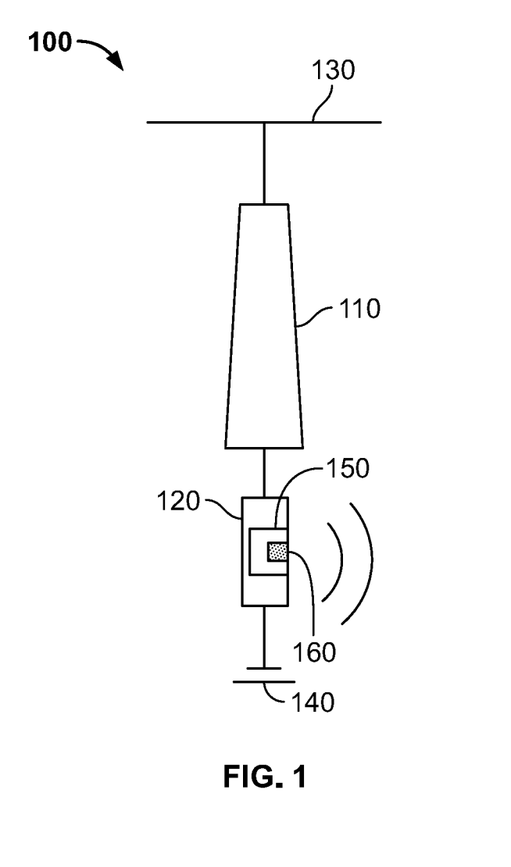
FIG. 1 is a schematic diagram of an arrangement of a surge arrester installed in series with a disconnector having an integrated monitoring device according to an embodiment.

FIG. 1 illustrates an exemplary arrangement 100 of a surge arrester 110 connected in series with a disconnector 120 between a power line 130 and ground potential 140. The disconnector 120 operates in the conventional manner to automatically disconnect the surge arrester 110 from ground in case the arrester 110 becomes permanently short-circuited so as to allow that the power line 130 is quickly re-established to normal operation conditions. A monitoring device 150, such as a sensor, may be integrated into the disconnector 120 to sense the present status of the disconnector 120, i.e. establish if the disconnector 120 has operated or not to disconnect the surge arrester 110 from ground 140, as it will be described later. The monitoring device 150 may include a communication device 160 for transmitting a signal indicative of the sensed disconnector status and/or other communication data. Alternatively, the monitoring device 150 may be a conventional sensor, such as a current sensor suitable for measuring a current passing through the disconnector, which can be coupled with separate communication device for transmitting sensed data.

Figure 2:
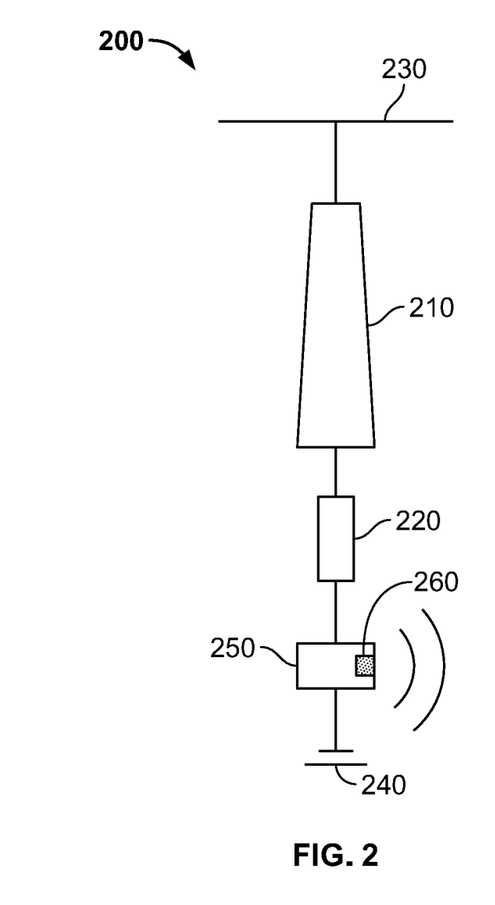
FIG. 2 is a schematic diagram of an arrangement of a surge arrester installed in series with a disconnector and an external monitoring device according to another embodiment.

FIG. 2 illustrates an alternative arrangement 200 of a surge arrester 210 installed with a conventional disconnector 220 between the respective power line 230 and ground potential 240. In this case, an external monitoring device 250 having functionalities similar to those of the integrated monitoring device 150 described above with reference to FIG. 1 may be coupled in series with the surge arrester 210 and the conventional disconnector 220 for monitoring the status condition thereof. The monitoring device 250 may include a communication device 260 for transmitting signals indicative of the disconnector status. Alternatively, a monitoring device 250 with only monitoring functionalities may be coupled to an external communication unit for communicating the monitored status of the disconnector 220. The supply of power to the monitoring devices 250 and/or respective communication electronics installed in conjunction with each monitored disconnector may be performed in an autonomous manner, as it will be described later.

A method for transmitting the status of monitored disconnectors 120 or 220 to a remote monitoring station at the end of a power transmission line, for e.g. at a base station of the power transmission system, is wireless communications. However, long range radio communications are expensive in terms of power and legal regulations regarding duty cycle and power transmitting towers generally cannot provide power for locally energizing sensors and transmitter electronics. The range for radio communications is also far shorter than the typical length of a transmission line and can be affected by various environmental factors, such as line of sight, weather and electromagnetic interference. Thus, long range radio communications are not particularly suitable for directly transmitting the status of a monitored disconnector 120 or 220 from a tower to a remote base station.

Low-power long-range radio transceivers provide low-power consumption along with a high data rate that is particularly suitable for transmitting sensitive information in real time, such as information on a disconnector status, with low power consumption. For instance, typical low-power radio transceivers operate at <0.1 watts of power. Depending on data rate, typical radios may have a range of up to 20 km line of sight. As such, low-power high-speed radio transceivers are particularly suitable for periodic transfer of small amounts of information, such as the sensed status of a surge arrester disconnector, where autonomy of power supply is a concern. The communication range associated with typical low-power radio transceivers is, however, reduced, which means that it may be used for communicating data between disconnectors physically located within a certain area defined by the communication range itself but not from a disconnector located far away from the base station.

The present disclosure provides a method of remotely monitoring the status of surge arrester disconnectors installed along a power line using low-power communications. The method is based on the use of a clustering technique to enable monitored disconnectors equipped or coupled with low-power high-speed radio transceivers to form self-organized clusters and to communicate with other monitored disconnectors that are physically located within a same cluster or in a neighboring cluster. A signal indicative of the operative status of a monitored disconnector can then be wirelessly transmitted from the monitored disconnector location to a remote monitoring station via a long-range wireless mesh communication system formed by the plurality of clusters along the power line while using low-power radio transceivers with short communication range.

Figure 3:
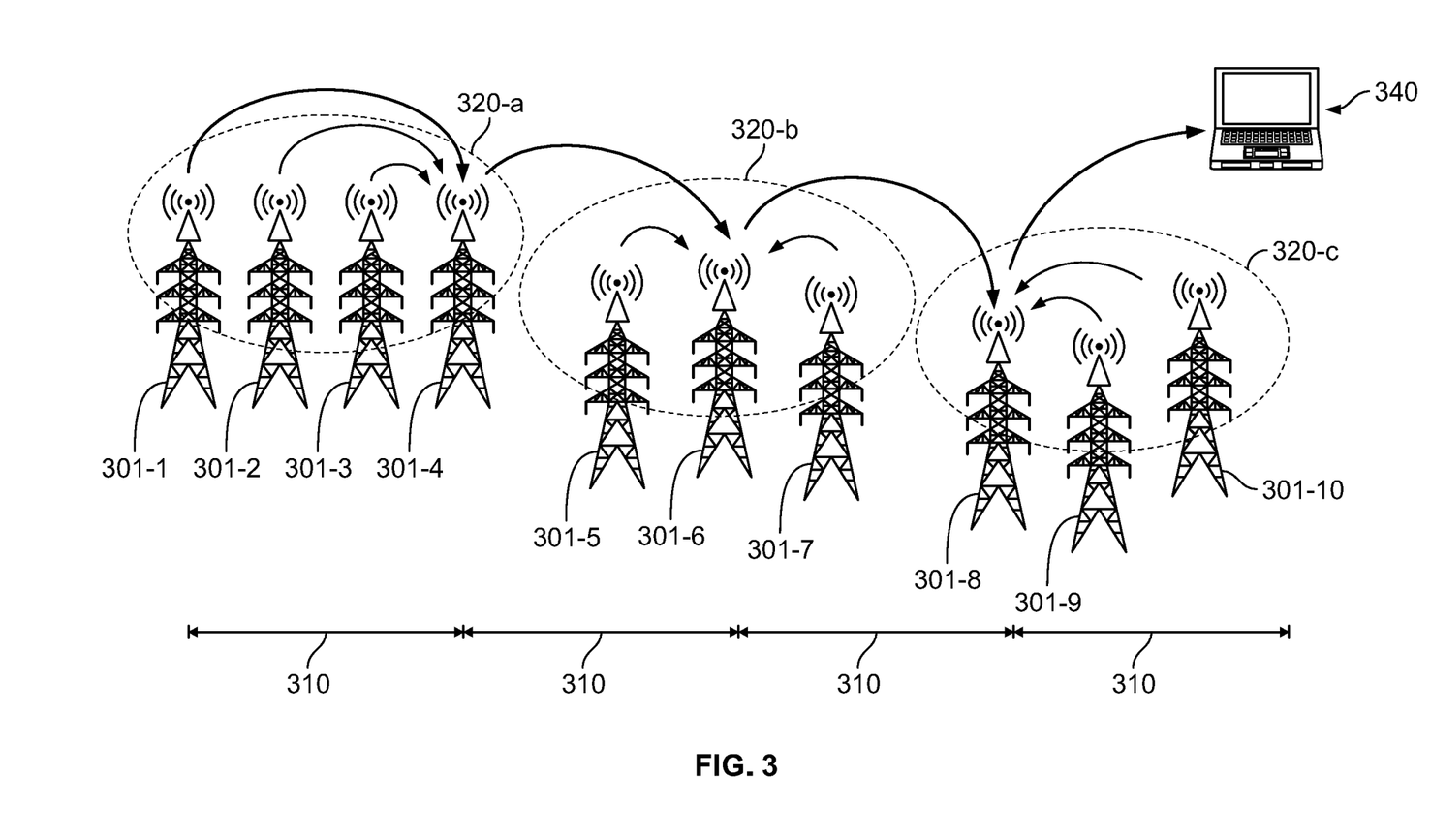
FIG. 3 is a schematic diagram of a wireless long-range communication mesh system for a dense distribution of monitored disconnectors along a power line according to an embodiment.

FIG. 3 illustrates an example of a wireless long-range mesh communication system 300 comprising a plurality of surge arrester disconnectors 301 installed along a power transmission line. In the shown embodiment, each of the disconnectors 301-1 to 301-10 has monitoring and communication capabilities, such as according to any of the configurations described above with reference to FIGS. 1 and 2. In particular, each of the monitored disconnectors 301-1 to 301-10 have integrated or are coupled to low-power high-speed radio transceivers and therefore, are capable of sensing and transmitting the respective status condition within a communication range 310 that is predetermined by the characteristics of the respective low-power high-speed radio transceivers.

Figure 6:
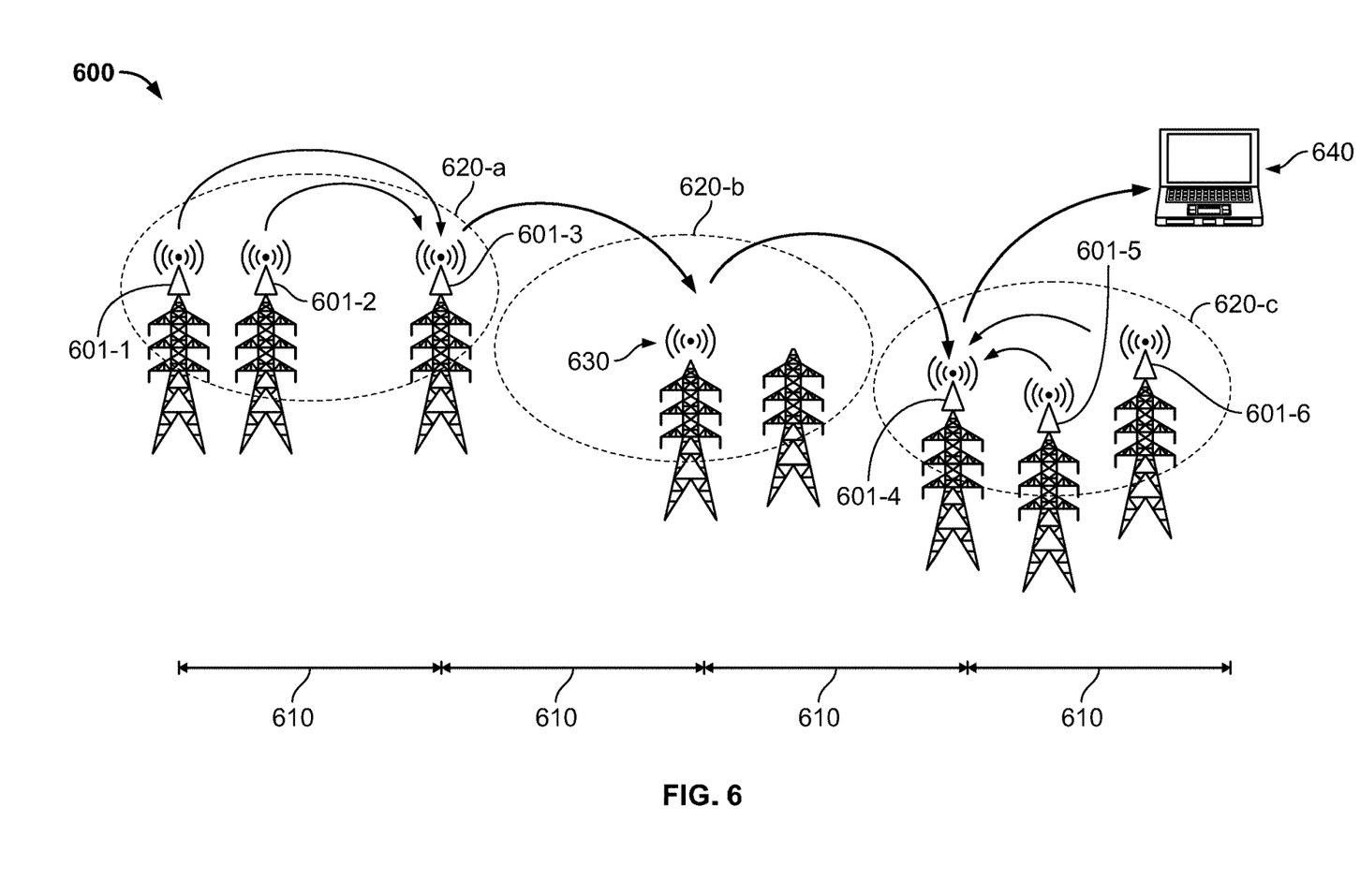
FIG. 6 is a schematic diagram of a wireless long-range communication mesh system including a repeater according to another embodiment.

The monitored disconnectors 301-1 to 301-10, as shown in FIG. 3, are organized in a plurality of clusters 320, in the illustrated embodiment clusters 320-a, 320-b and 320-c, according to their physical location and the communication range 310 associated with the respective low-power high-speed transceivers. Each of the clusters 320-a to 320-c comprises one or more monitored disconnectors 310 physically located within the same cluster area. The size of each cluster 320 may be defined based on the communication range 320 and the distribution of the monitored disconnectors 301 along the power line. In the illustrated embodiment of FIG. 3 the monitored disconnectors 301-1 to 301-10 are densely distributed, i.e. the monitored disconnectors 301-1 to 301-10 are separated from each other by less than the communication range 310 of the respective low-power radio transceivers. In this case, the clusters 320 may be defined as non-overlapping regions along the power line, each cluster 320 covering a designated area of approximately the size of the communication range 310. The monitored disconnectors located within a same designated area will be assigned to the respective cluster. This means that any cluster may comprise a number of monitored disconnectors different from adjacent cluster, as exemplified in FIG. 3 for clusters 320-a and 320-b, or eventually, no monitored disconnectors as shown in FIG. 6.

The organization and distribution of the monitored disconnectors over the plurality of clusters will determine how a status signal from a monitored disconnector i is transmitted over the long-range communication mesh system (where i is an integer varying from 1 to n, n representing the total number of monitored disconnectors installed along a power line), as it will be explained in the following.

Referring to FIG. 3, the transmission of a status signal of a monitored disconnector, for e.g. disconnector 301-1, may be first transmitted to a disconnector within the same cluster 320-a, for e.g. the disconnector 301-4, that is designated to act as a transmitting node of the cluster, i.e. the cluster head for receiving status signals from monitored disconnectors within the same cluster and transmitting the status signals to an adjacent cluster. The cluster head 301-4 will then transmit the received status signal to one of the monitored disconnectors 301 in the next adjacent cluster 320-b or to the respective head cluster, if designated. In the illustrated embodiment, each of the clusters 320-a to 320-c includes a designated monitored disconnector as the respective cluster head, i.e. the disconnectors 301-4, 301-6 and 301-8 in FIG. 3.

The status signal of a monitored disconnector is then transmitted along the long-range communication mesh system 300 from the head cluster of a cluster receiving the status signal (for e.g., see refs. 301-6 and 320-b in FIG. 3) to the head cluster of the next neighbor cluster (see refs. 301-8 and 320-c in FIG. 3). The cluster heads 301-4, 301-6, and 301-8 then act as receiving and transmitting nodes along the long-range communication mesh system 300, which allows greatly reducing the number of communications between nodes along the power line, and consequently, the amount of consumed power. The cluster heads, in an embodiment, are equipped with low-power high-speed radio transceivers similar to those of the other monitored disconnectors, and therefore, perform communications with the same low-power communication range. However, it may be envisaged to equip one or more cluster heads with communication units capable of transmitting with a communication range higher than of the other monitored disconnectors, particularly in cases where it might be advantageous to bridge a transmission gap larger than the communication range achieved by the low-power high-speed radio transceivers of the other disconnectors in the cluster.

The cluster heads are selected, in a random manner, from the monitored disconnectors within a same cluster that have integrated and/or are coupled to communication electronics. Alternatively, cluster heads may be designated based on the location of the monitored disconnectors within a cluster, such as the disconnector having the most favorable location for communicating with neighboring clusters. Further, in case the monitored disconnectors along the power line have different communication ranges, the monitored disconnector having the longest communication range within a cluster may be designated has the head of the respective cluster.

The designated cluster heads may also be dynamically changed with time based on the present operating status of the monitored disconnectors in the long-range mesh communication system. For instance, in case a cluster head is no longer communicating status data for the reason that the cluster head itself operated to disconnect a failed surge arrester, the communication method may automatically detect this event and change the designated cluster head to another one of the monitored disconnectors with communication functionalities within the same cluster. Thus, it is possible to re-establish communication of status data along the long-range mesh communication system in case an initially selected cluster head is no longer operative.

Figure 4:
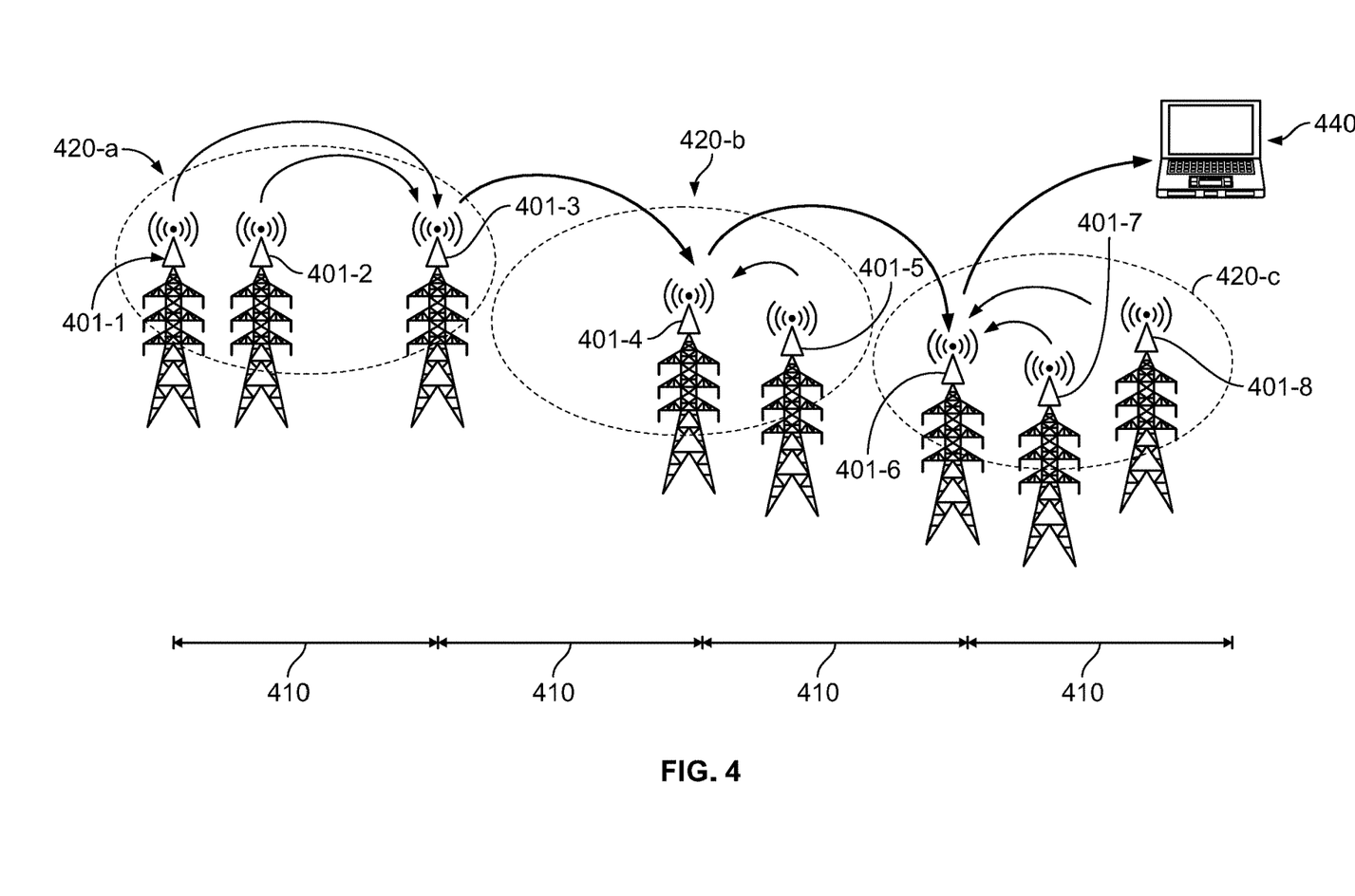
FIG. 4 is a schematic diagram of a wireless long-range communication mesh system for an irregular distribution of monitored disconnectors along a power line according to another embodiment.

The transmission of a status signal from a head of a receiving cluster to the head of an adjacent cluster is also advantageous in cases where the monitored disconnectors are not homogeneously distributed over the power line and/or are more densely distributed in certain areas, such as the long-range mesh communication system 400 illustrated in FIG. 4. The long-range mesh communication system 400 comprises a plurality of monitored disconnectors 401, the monitored disconnectors 401 having monitoring and/or communication functionalities similar to those of the monitored disconnectors 301 described above with reference to FIG. 3. In the present case, each of the clusters 420-a, 420-b and 420-c are assigned with respective cluster heads 401-3, 401-4 and 401-6, each of the monitored disconnectors 401 reporting its status to the respective head of the same cluster. The status signal from any of the monitored disconnectors 401 is then consecutively transmitted from a receiving cluster to a next cluster along the long-range mesh communication system 400 until reaching an end cluster 420-c that is within a communication range 410 of the cluster head 420-c from a base station 440 of the power line. The status signal received by the end cluster 420-c are then communicated to the base station 440.

The transmission of the status signal of a monitored disconnector over the network of monitored disconnectors in a cluster-to-cluster fashion as described above allows reducing the number of node-to-node communications until reaching the monitoring station at the end (or at an intermediate position) of the power line, and consequently, the consumed power, as compared to transmitting a status signal from one disconnector to the next disconnector along the network of monitored disconnectors.

Figure 5:
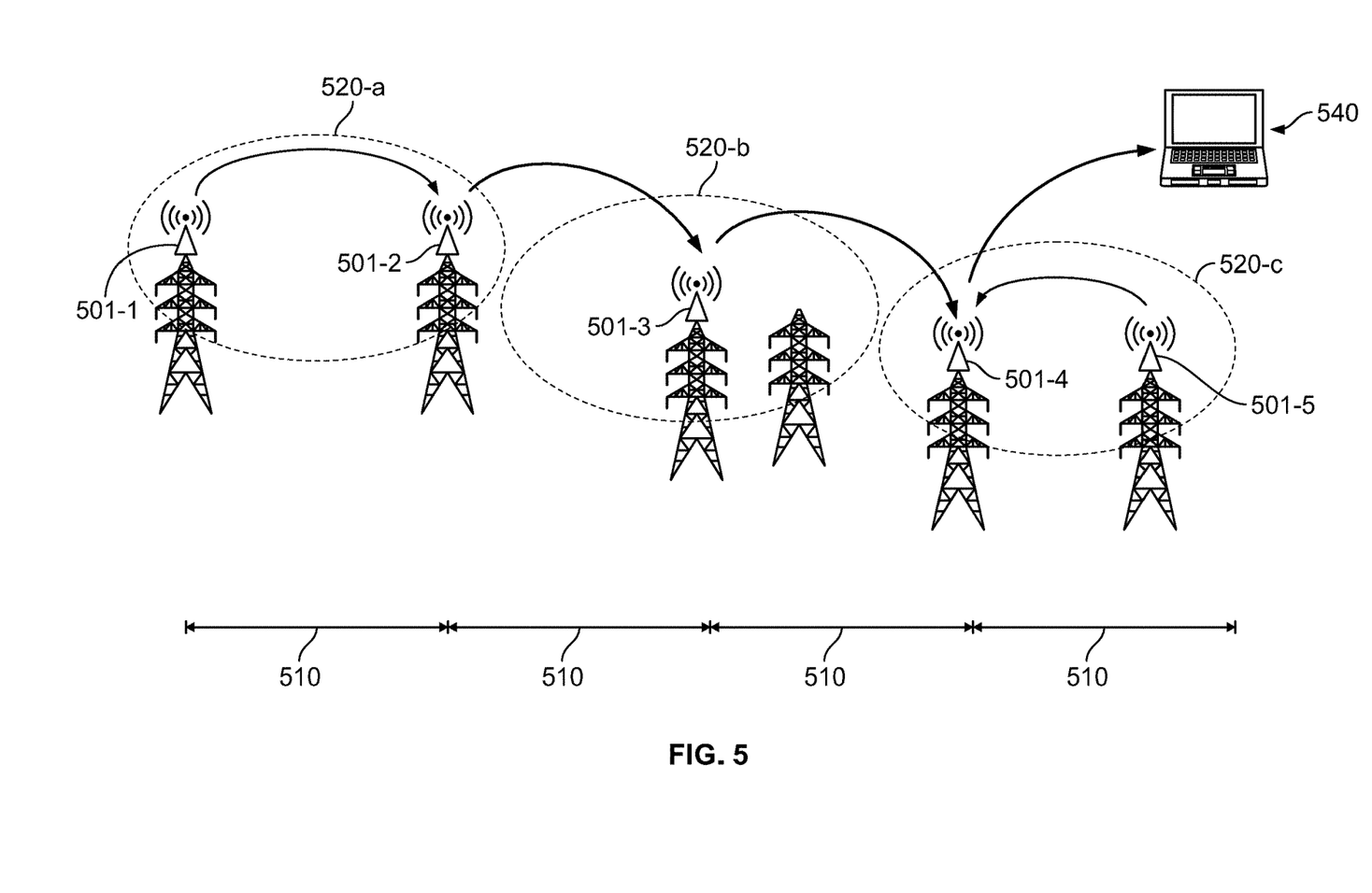
FIG. 5 is a schematic diagram of a wireless long-range communication mesh system with a low density of monitored disconnectors along a power line according to another embodiment.

A linear transmission of a status signal between consecutive monitored disconnectors may, however, take place in power lines which have a low density of monitored disconnectors over the entire power line length or in certain areas. FIG. 5 schematically depicts a long-range mesh communication network 500 in a power line having a low density of towers installed with monitored disconnectors 501. The monitored disconnectors 501-1 to 501-5 have monitoring and/or communication functionalities similar to the monitored disconnectors 301 described above with reference to FIG. 3. Further, the cluster heads may be selected as corresponding to disconnectors that are separated from each other by a distance of approximately the low-power communication range 510 so as to maximize the distance between the cluster heads, each of the remaining monitored disconnectors 501-1, 501-4 reporting its status to the respective head of the same cluster. As the size of the clusters 510-a, 510-b and 510-c is determined based on the low-power communication range 510, some of the clusters may include only one or two monitored disconnectors.

In each of the examples described above with reference to FIGS. 3-5, the transmission of a status signal from a receiving cluster to the next cluster is achieved by designating one of the monitored disconnectors in each cluster as the head of the cluster and which will participate in the long-range mesh communication network to pass status information along the power line, i.e. the cluster head receive the status information of a monitored disconnector from the head of a preceding cluster and transmits the received status to the next cluster along the power line. Thus, a wireless transmission of a monitored status condition can still be achieved in a reliable manner and with low consumption of power.

Any low power communication protocol can be used in association with the long-range mesh communication systems described above.

In areas where the low-power communication range of the monitored disconnectors is not sufficient to reach the next monitored disconnector on the power line and/or on the next cluster, repeaters may be installed at intermediate positions to strengthen the signal to be transmitted to the next monitored disconnector and/or cluster and fill in the gaps. For instance, FIG. 6 illustrates a long-range mesh communication system 600 comprising a plurality of monitored disconnectors 601-1 to 601-6 which are so sparsely distributed that an intermediate area 610-b along the power line and larger than the low-power communication range 620 provided by the low-power radio transceivers installed with the cluster heads 601-3 and 601-4 of the clusters 620-a and 620-c is depleted from any disconnector having monitoring and/or communication capabilities. In this case, a repeater 630 may be provided at the depleted area 620-b for transmitting a signal from the cluster 620-a to the cluster 620-c. Repeaters 630 may be powered via solar energy if they cannot be installed in a substation where power is available, as they are not attached to an arrester and, hence, do not have access to the leakage current that can be used to power the monitored disconnectors, as it will be explained hereinafter. This means that a repeater 630 with a communication range larger than the low-power communication range 610 achieved by the low-power high-speed radio transceivers associated with any of the monitored disconnectors 601-1 to 601-6 may be used. This allows to bridge large gaps in the distribution of monitored disconnectors along the power line.

After the monitored disconnectors have formed their own communications network and clarified the state of each disconnector, this information may then be communicated to the base station located at the end of the power line. At the base station, there are optional means of backhaul communication to a monitoring device or signal or use SCADA systems, using conventional communication techniques. It is understood that the number of monitored disconnectors comprised in the long-range mesh communication system according to the principles of present invention can be any integer number, depending on the application, and should not be construed as being limited to the number of monitored disconnectors described above with reference to the illustrated embodiments.

In a further embodiment, a simplified monitoring technique may be used for power distribution systems, especially together with a lightning detection system, so that disconnectors near a location of a lightning stroke can be contacted via radio or mobile and checked if they have operated or not.

In another embodiment, a method for regular maintenance using disconnectors with a low power radio transceiver having a contact distance of 30 to 200 meters may be used. In this case, a maintenance operator can drive along a distribution line with a sender/device that contacts the low power radio transmitter of the disconnector and checks if these have not operated or not. This method facilitates the detection of failed arresters in comparison to visual inspections. Operators and maintenance teams of power distribution system will need less effort and tie for inspecting lines to locate failed surge arresters. Furthermore, the communications link may be used for other sensing solutions.

B. Autonomous Power Supply for Monitoring and/or Communication Devices Installed with Remote Surge Arresters In general, the towers of power transmission and/or power distribution systems cannot provide power to electronic devices installed locally, such as monitoring and/or communication devices, which then have to be installed with their own power sources like batteries.

In order to avoid the problems associated with regular maintenance of conventional power sources mentioned above, it is possible to supply power to sensors and/or communication electronics installed with a surge arrester by utilizing the small but continuously available leakage current of the arrester, which is typically in the range of 1 to several milliamps at a driving voltage of some hundreds of volts, if required. This leakage current is available as long as the arrester is connected to the power line and in normal operating conditions.

Accordingly, an aspect of the present disclosure lies in harvesting the energy from the electric field or the arrester leakage current passing through the arrester and disconnector, and using this leakage current to charge a capacitor or capacitor bank. The stored charge can then be used for supplying power to sensors and/or communication electronics locally installed with the surge arrester and disconnector. High efficiency, low-power step-down converters may be used to provide a stabilized voltage level.

Figure 7:
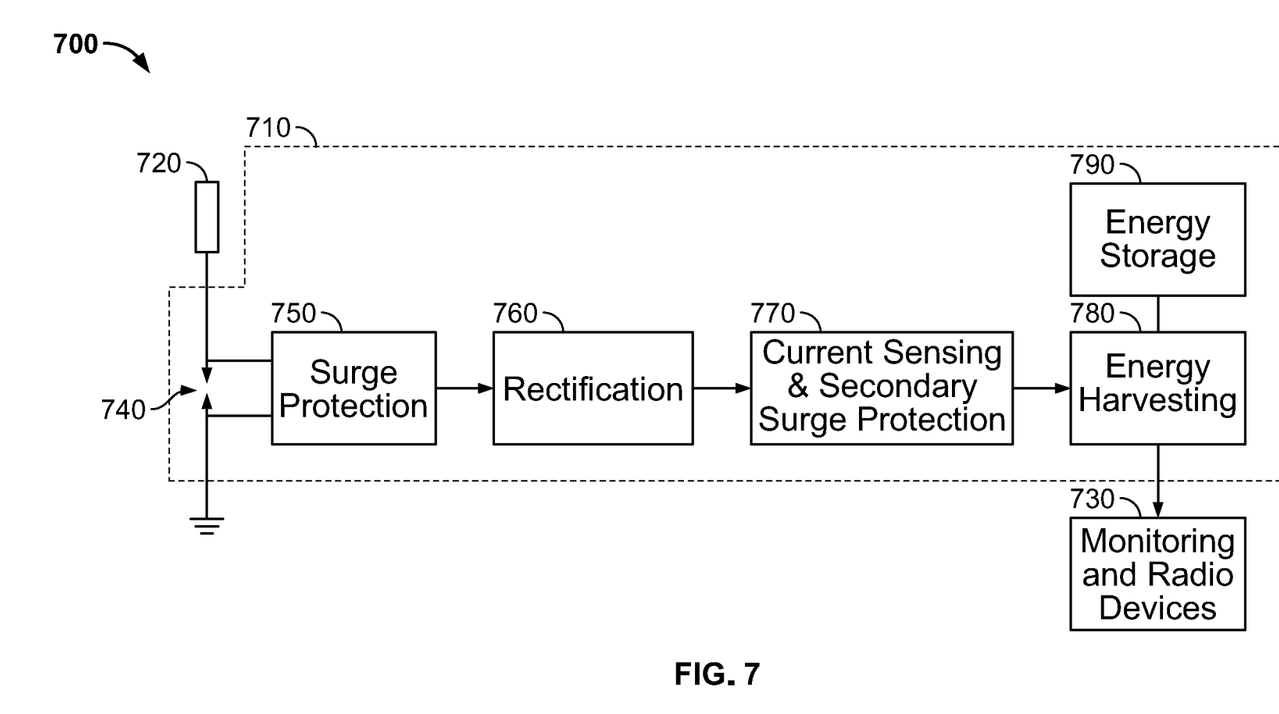
FIG. 7 is a block diagram of an energy harvesting system according to an embodiment.

An energy harvesting scheme 700 according to the principles of the present invention is illustrated in FIG. 7. An energy harvesting unit 710, in the shown embodiment, is connected in series with the arrester and disconnector ensemble 720 so as to receive the leakage current that continuously flows from the surge arrester, via the disconnector, to ground when the arrester is in normal operating conditions and the disconnector has not been operated. The energy harvesting unit 710, in an embodiment, includes a minimum of two levels of over-voltage protection to prevent failure of connected electronic devices, such as monitoring and radio communication devices 730. The first level of over-voltage protection 740 includes a coarse protection against surges by establishing a bypath to ground in case high transient currents are absorbed by the arrester. This function can be provided by suitable spark gaps 740 identical or similar to those already utilized in conventional disconnector devices.

Because the spark over-voltages tend to be quite high, a second level of over-voltage protection 750 is provided for protecting the connected electronic devices 730 during the time that the voltage rises to the spark over-voltage level. The turn-on characteristic of the second level protection 750 is coordinated with the first level protection 740 (staggered protection). Any staggered protection scheme well-known by those skilled in the art of surge protections may be used. A staggered protection scheme requires the coordination of threshold and residual voltages of the protection devices as well as the impedance connected between the protection stages. Otherwise, it could happen that the second level protection 750 prevents the first level protection 740 from operating, due to a too low residual voltage of the second level protection 750.

The energy harvesting unit 710, as shown in FIG. 7, may further include a current rectification stage 760, followed by a current sensing stage 770 for monitoring the harvested current and with additional secondary surge protection, and energy harvesting and storage stages 780 and 790 for collecting and storing the charges from the leakage current received from the previous stages. The stored energy can then be used for supplying power to the monitoring and radio devices 730 installed at the surge arrester location.

Figure 8:
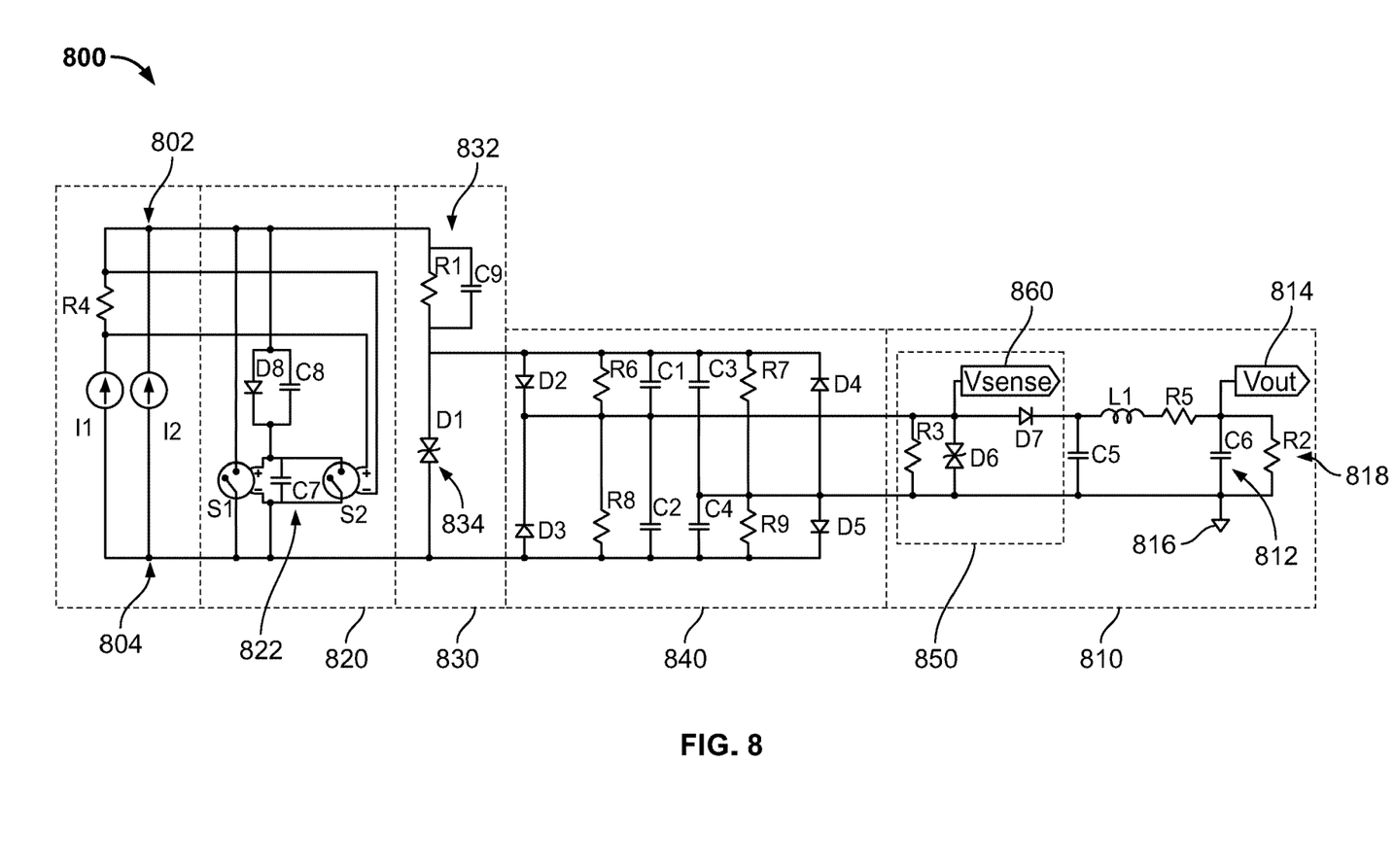
FIG. 8 is a circuit diagram of an energy harvesting device according to an embodiment.

FIG. 8 represents schematically a circuit diagram of an energy harvester apparatus 800 according to an embodiment for collecting and storing charge from the leakage current passing through a surge arrester installed in conjunction with a disconnector. Referring to FIG. 8, the energy harvester apparatus 800 comprises first and second input terminals 802, 804 to be coupled in series with a surge arrester disconnector, such as the disconnectors 120 and 220 shown in FIGS. 1 and 2, and the ground potential to collect charge from the leakage current that flows from the surge arrester down to the ground potential. The energy harvester apparatus 800 includes an energy storage circuit 810 comprising a storage capacitor 812 for storing the charge collected from the leakage current and to supply the stored charge, via first and second output terminals 814 and 816, to an electronic device (represented as a load 818 in FIG. 8), such as a sensor device or communication device.

The first level of over-voltage protection may be implemented by a first over-voltage protection arrangement 820 as illustrated in FIG. 8. The first over-voltage protection arrangement 820 is coupled across the first and second input terminals 802 and 804 and is designed to establish a bypass path when a transient voltage above a first threshold is applied across the first and second input terminals 802, 804. As mentioned above, the first over-voltage protection arrangement 820 may comprise a spark gap circuit 822 to establish the bypass path when transient voltages at the input terminals 802, 804 arise above the breakdown voltage of the respective spark gap circuit.

The second level of surge protection may be implemented by a second level over-voltage protection arrangement 830 as illustrated in FIG. 8. The second level over-voltage protection arrangement 830 is coupled in parallel to the first level of over-voltage protection arrangement 820 for providing surge protection during the time that the voltage rises to the spark over-voltage level in the first level, and establishes a bypath when the transient voltage rises above a second threshold which is lower than the first threshold. As mentioned above, the turn-on characteristic of the second level over-voltage protection arrangement 830 is, in an embodiment, coordinated with the first level over-voltage protection arrangement 820. Transient-voltage-suppression diodes (TVS), such as bi-directional Transzorb diodes in combination with suitable low-inductance resistors (e.g. carbon composition resistors) with respective resistor element R1 are recommended for this purpose. Transzorb diodes are very fast and, in case of an overload event, they fail short and continue to protect the equipment.

The resistor R1, shown in FIG. 8, is part of the staggered protection arrangement 830 and may also include a parallel capacitor. The arrangement 832 is used for limiting the current through this level of protection at the time when the residual voltage of the previous stage is highest. The protection level of Transzorb diode is comparably low (can be selected between approximately 3 V to 20 V) but energy handling capability is limited. Therefore, the voltage drop across the resistor R1 needs to be high enough to trigger the first level protection at higher discharge currents before the Transzorb diode 834 is failing. If required, another level of similar protection may be inserted in between the described levels using a gas discharge tube instead of a Transzorb diode with low-inductance series resistors with a protection level somewhere between the first and the last level.

The energy harvester apparatus 800 may also comprise a rectifier arrangement, such as a capacitive graded rectifier 840 shown in FIG. 8 coupled after the first and second over-voltage protection arrangements 820, 830 for supplying a rectified current to the energy storage circuit 810. The capacitive graded rectification may be achieved by integrating resistance and capacitive elements, such as the elements R6 to R9 and C1 to C4, respectively, in a rectification bridge formed by diodes D2 to D5 as illustrated in FIG. 8.

The energy storage circuit 810 may further comprise a current sensing circuit 850 coupled to capacitive graded rectifier 840 as illustrated in FIG. 8 for sensing a current (and/or voltage) output by the capacitive graded rectifier 840, for e.g. at the output monitoring terminal 860, Vsense, shown in FIG. 8. The current sensing circuit 850 may also include a secondary level of fine surge suppression, for instance, including a TSV diode D6, such as described above, coupled in parallel to a resistance element R3. The charge collected from the leakage current is then stored at a storage capacitor C6 and can be supplied to an external device via the output power supply terminal 814, Vout. The current sources 11 and 12 shown in FIG. 8 represent the sources of an AC current and a surge current, respectively, applied to the input terminals 802 and 804 of the energy harvester apparatus 800.

Thus, the leakage current can be harvested and stored by the energy harvesting device 800 to provide power for the monitoring wireless electronics installed locally at the surge arrester, since there is always a small continuous capacitive leakage current of a few mA down to earth, and for some arresters just below 1 mA, when the arrester is energized.

The energy harvester apparatus 800 may serve itself as a monitoring device for detecting if the surge arrester disconnector has operated, because the stored power will gradually decrease when the disconnector disconnects the arrester from ground, thereby interrupting the flow of leakage current from the surge arrester to ground, and consequently, the storage of charge by the energy harvester apparatus 800.

Exemplary values for the electric components shown in FIG. 8

R1=20☐, R2=10 k☐☐☐R3=1 M☐; R4=1☐
R5=R6=R7=R8=R9=1 M☐
D1=SMBJ05CA; D6=SMBJ08CA
D2=D3=D4=D5=D7=MURS120
C1=C2=C3=C4=100 pF
C5=100 ☐F; C6=47 ☐F; C8=1 fF; C9=10 pF
L1=1 mH

The principles of the energy harvesting scheme 700 and/or the energy harvesting apparatus 800 described above may be applied as the monitoring device integrated and/or coupled to the monitored disconnectors described above with reference to the embodiments of FIGS. 1 to 6. Further, the described energy harvesting scheme 700 and/or the energy harvesting apparatus 800 may be used separately from the long-range mesh communication system in other applications than the remote detection of failed surge arresters, for e.g. to detect a failure in the supply of current to an electronic device.

Experimental tests with respect to surviving typical arrester current surges down to earth and to harvest power from arrester leakage currents were carried out for an energy harvesting device prototype according to the present invention. Table 1 shows a summary of the requirements obtained for an exemplary energy harvesting device.

TABLE 1

Input data for an energy harvesting device.
Parameter

| | |
|---|---|
| Typical Leakage Current | ~1 mA RMS |
| Maximum Leakage Current | As above in normal conditions |
| Maximum surge | 100 kA (Direct Lightening Strike) |
| Typical surge | 40 kA (lightening) and 2 kA (Switching) |
| Spark Gap Protection | As per existing disconnector design |
| Maximum current around the spark gap | 10 A for 150 ms |

Successful withstand tests were performed at both 10 kA and 56 kA impulses and wave shape of 8/20 ps. The capacitor used for storage in the energy harvesting device prototype was a 2200 pF. Simulations were done for 1 kV & 1 mA and 2 kV & 2 mA. Tests were then conducted with the same parameters. Table 2 shows actual test results from the harvesting tests in a high voltage environment.

TABLE 2

Energy harvesting results
Results

| Voltage & current | Elapsed time (s) | Increase in voltage (V) | Increase in charge (pC) | Charge current (mA) |
|---|---|---|---|---|
| 1 kV & 1 mA | 54.00 | 10.99 | 24171 | 0.44 |
| 2 kV & 2 mA | 32.37 | 12.97 | 28533 | 0.88 |

Figure 9:
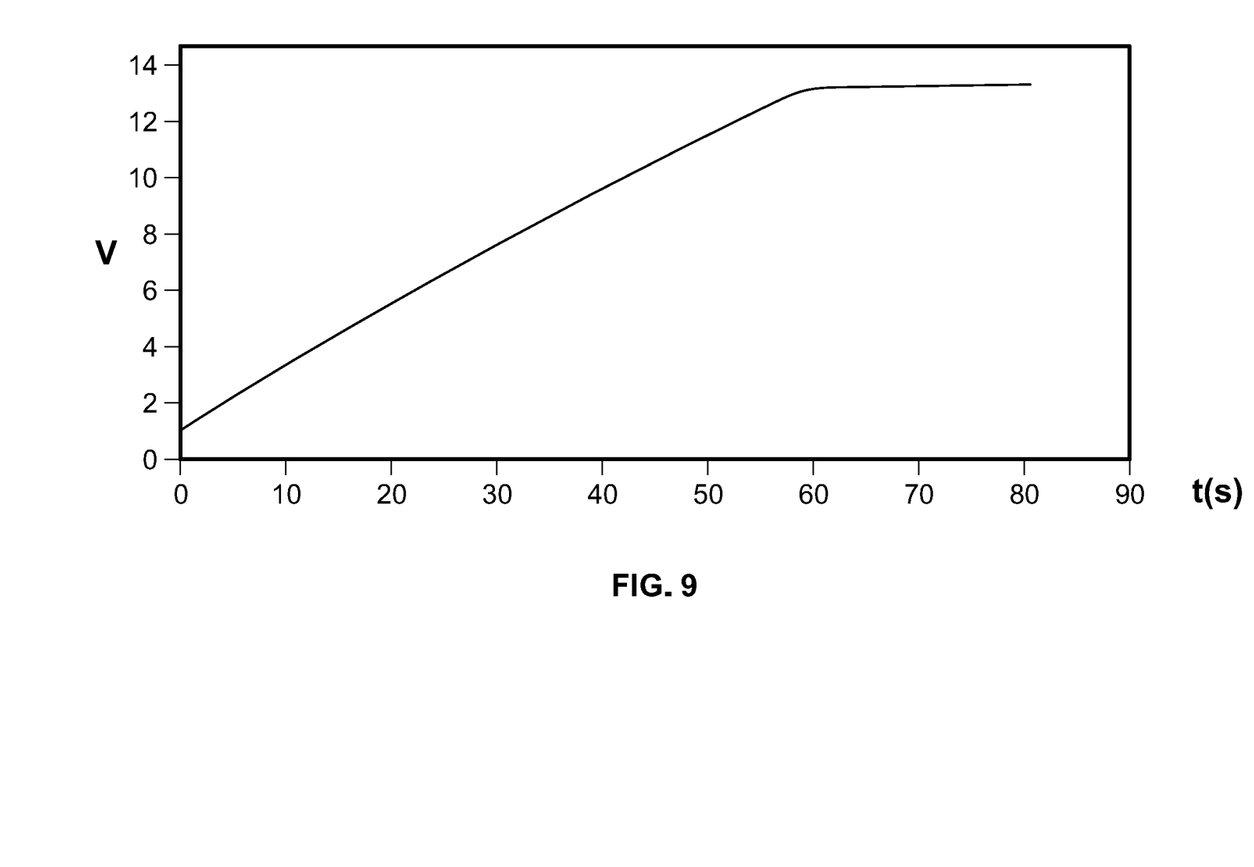
FIG. 9 is a graph of a capacitor bank using a leakage current of an arrester as a function of time.

FIG. 9 shows a graphic of the charge recorded during testing at 1 kV and 1 mA, which is in line with the simulations. The simulations indicated a usage of 0.7 pC/s during sleeping and around 72 mC/s totally for transmitting, receiving, and processing. Charging gained assumed was 0.27 mC/s. Power assumed to be used only when voltage is above 2.25V.

After charging the device at 2 kV & 2 mA the sample was submitted to 10 kA impulses every 60 seconds to a total of 20 current discharges. The communication link dropped after the first impulse but the data acquisition system kept logging internally.

D. Gps Information

During installation of line surge arresters, the exact tower and position for each arrester may not be fixed in advance. Hence the exact GPS position for each line arrester must be determined during installation or at the first radio communication. Fixing the GPS position at first communication has the disadvantages with respect to the power requirements. A mobile app may be used at the installation point so that the GPS position can be downloaded into each disconnector without using excessive power from the disconnector. For instance, it is envisaged to use a smart phone and barcodes on the disconnector so that an installer can load the GPS data into the phone and download it back at the office for knowing the exact position of each disconnector.

E. Method of Fault Indication

When a line surge arrester is overloaded it triggers the disconnector to operate. The disconnector will quickly separate itself into two or more pieces so that the earth lead to ground is disconnected from the arrester. In most cases, this may result in the destruction of any monitoring electronics/equipment installed with the surge arrester and/or disconnector. Therefore, the reporting of a disconnector operation must be indirect, so it just reports that it is alive as long as it sees the arrester leakage current. A missing answer of a single node disappearing will be considered a disconnecting event.

In addition, each monitored disconnector might be able to report the status of its power source. Thus, in the unlikely event that the monitoring electronics survives the short-circuit current and disconnecting event, the monitoring device can report that its power source has stopped. Further, as leakage current is no longer being collected for storage in the energy harvesting device, the energy reserves will be exhausted at a later time and the monitored disconnector node will disappear from the network of monitored disconnectors. The absence of reception of a status signal from the monitoring device associated with a disconnector provides an indication that the disconnector likely operated for disconnecting the failed arrester from ground. An operator at a remote base station can clearly distinguish the absence of a status signal from a monitored disconnector that disconnected a failed surge arrester from the case where no reception of status signals is caused by a general power shut off or other reasons, since in this case all disconnector nodes will disappear.

Embodiments of the present invention have been mainly described above with reference to disconnectors used in combination with medium and high voltage surge arresters for facilitating fast closing of power distribution and transmission lines. However, the principles of the present invention can also be advantageously applied to quickly detect and/or localize failure of other type of electronic devices. For instance, the principles of the present invention can be applied to connectors, for e.g. by using thermal sensing to detect loose and/or overheated connectors. A further application includes cable accessories, in which joints and terminations may sense PD or thermal effects. The principles of the present invention may also be applied to detect leakage currents in insulators, as an indicator that cleaning is required.

Moreover, the method of remotely monitoring a status of a surge arrester disconnector via a long-range communication wireless mesh communication system, the method of detecting a failed surge arrester and the energy harvester apparatus described above may be used independently of each other and/or for other applications that those described above.

Although embodiments above have been described with reference to status signals that are propagated along the long-range mesh communication system until reaching a base station at the end (or at an intermediate position) of the power line, the base station may also send signals to a monitored disconnector, such as the nearest cluster head, for communicating data or a status inquiry to the respective monitored disconnector and/or cluster head. In addition, each monitored disconnector or cluster head may be equipped with or coupled to communication electronics suitable for transmitting signals received from the base station to another monitored disconnector or cluster head in the long-range mesh communication system, such as by using any of the cluster-to-cluster communication methods described above.

What is claimed is:

1. A method of remotely monitoring a status of a surge arrester disconnector, comprising:
   providing a long-range wireless mesh communication system including a plurality of surge arrester disconnectors organized in a plurality of clusters, each cluster includes a plurality of surge arrester disconnectors that are physically located within a same cluster area, at least one of the surge arrester disconnectors in each cluster is coupled to a communication device of a predetermined communication range for transmitting a signal indicative of a disconnector status;
   transmitting, from a first cluster of the plurality of clusters, a status signal indicative of a status of a first surge arrester disconnector in the first cluster to a second cluster located within the predetermined communication range from the first cluster;
   consecutively transmitting the status signal from the second cluster that receives the status signal to a third cluster within the predetermined communication range, until reaching an end cluster on the long-range mesh communication system;
   transmitting, from the end cluster, the status signal to a monitoring station;
   monitoring the status of the first surge arrester disconnector at the monitoring station based on a result of transmission of the status signal, at least one of the plurality of clusters includes a surge arrester disconnector coupled to the communication device and configured to act as a cluster head, the cluster head receiving a plurality of status signals from the plurality of surge arrester disconnectors included in the same cluster and transmitting the status signals to an adjacent cluster within the predetermined communication range; and for each of the plurality of clusters, randomly selecting a surge arrester disconnector from the plurality of surge arrester disconnectors coupled to the communication device that are included in the same cluster for acting as the cluster head.

2. The method of claim 1, wherein absence of reception of the status signal is indicative of the first surge arrester disconnector having operated to disconnect a respective surge arrester from ground.

3. The method of claim 1, wherein the status signal is transmitted from any of the plurality of clusters via low-power high-speed radio communications.

4. The method of claim 1, wherein, when it is detected that the cluster head of the cluster is not communicating, automatically selecting an operative disconnector from the plurality of surge arrester disconnectors coupled to the communication device that are included in the same cluster as the cluster head.

5. The method of claim 1, wherein each of the plurality of clusters includes a cluster head, the transmitting of the status signals between adjacent clusters is performed by the cluster heads.

6. The method of claim 1, wherein the status signal of the first surge arrester disconnector is transmitted directly between adjacent clusters that are separated from each other by a distance of substantially the predetermined communication range.

7. The method of claim 1, wherein the status signal of the first surge arrester disconnector is transmitted between adjacent clusters that are separated from each other by more than the predetermined communication range via a repeater.

8. A method of detecting a failed surge arrester from a monitoring station remote to the surge arrester, comprising:

providing the surge arrester connected in series with a disconnector configured to automatically disconnect the surge arrester from ground in case of a failure;

collecting charge from a leakage current that flows from the surge arrester to ground via the disconnector and storing the collected charge in a storage capacitive element;

powering a monitoring device and/or a communication device installed at the surge arrester using the charge stored in the storage capacitive element; and monitoring reception of a signal transmitted from the monitoring device and/or the communication device at the monitoring station, absence of reception of the signal is indicative of the disconnector having operated to disconnect the surge arrester from ground.

9. An energy harvester apparatus for harvesting energy from a leakage current of a surge arrester, comprising:

a first input terminal and a second input terminal coupled in series with the surge arrester and ground potential to collect the leakage current that flows from the surge arrester; and an energy storage circuit having a storage capacitor adapted to store charge from the collected leakage current and to supply the stored charge, via the first input terminal and the second input terminal coupled to the storage capacitor, to an electronic device.

10. The energy harvester apparatus of claim 9, further comprising a first over-voltage protection arrangement coupled across the first input terminal and the second input terminal and adapted to establish a bypass path when a transient voltage above a first threshold is applied across the first input terminal and the second input terminal.

11. The energy harvester apparatus of claim 10, wherein the first over-voltage protection arrangement has a spark gap circuit adapted to establish the bypass path when the transient voltage is above a breakdown voltage.

12. The energy harvester apparatus of claim 10, further comprising a second over-voltage protection arrangement coupled in parallel to the first over-voltage protection arrangement and adapted to establish a bypath to ground when the transient voltage rises above a second threshold, the second threshold being lower than the first threshold.

13. The energy harvester apparatus of claim 12, wherein the second over-voltage protection arrangement has a transient-voltage-suppression diode adapted to bypass a transient current to ground.

14. The energy harvester apparatus of claim 12, further comprising a capacitive rectifier arrangement coupled to at least one of the first over-voltage protection arrangement and the second over-voltage protection arrangement to rectify a current output by the first over-voltage protection arrangement and/or the second over-voltage protection arrangement and to supply the rectified current to the energy storage circuit.

15. The energy harvester apparatus of claim 9, wherein the energy storage circuit includes a current sensing circuit adapted to sense a current received by the energy storage circuit.

* * * * *